United States Patent [19]
Hideshima et al.

[11] Patent Number: 5,143,865
[45] Date of Patent: Sep. 1, 1992

[54] METAL BUMP TYPE SEMICONDUCTOR DEVICE AND METHOD FOR MANUFACTURING THE SAME

[75] Inventors: Makoto Hideshima, Tokyo; Tetsujiro Tsunoda, Fujisawa; Shinjiro Kojima, Chigasaki; Masaru Ando, Kamakura, all of Japan

[73] Assignee: Kabushiki Kaisha Toshiba, Kawasaki, Japan

[21] Appl. No.: 731,392

[22] Filed: Jul. 17, 1991

Related U.S. Application Data

[63] Continuation of Ser. No. 399,234, Aug. 29, 1989, abandoned.

[30] Foreign Application Priority Data

Sep. 2, 1988 [JP] Japan .................. 63-219726

[51] Int. Cl.⁵ ........................................... H01L 21/28
[52] U.S. Cl. .................. 437/183; 437/189; 437/225
[58] Field of Search .............. 437/183, 189, 225

[56] References Cited

U.S. PATENT DOCUMENTS 4,558,510 12/1985 Tani et al. .
4,818,724 4/1989 Cetronio et al. ............... 437/183

FOREIGN PATENT DOCUMENTS

| 0264648 | 4/1988 | European Pat. Off. . |
| 53-44176 | 4/1978 | Japan . |
| 53-89368 | 8/1978 | Japan . |
| 54-026675 | 2/1979 | Japan . |
| 55-163830 | 12/1980 | Japan . |
| 57-078173 | 5/1982 | Japan . |
| 57-44440 | 9/1982 | Japan . |
| 58-051511 | 3/1983 | Japan .................. 437/183 |
| 59-42197 | 3/1984 | Japan . |
| 59-090941 | 5/1984 | Japan .................. 437/183 |
| 59-178778 | 10/1984 | Japan .................. 437/183 |
| 60-35804 | 8/1985 | Japan . |
| 61-59548 | 12/1986 | Japan . |
| 62-104143 | 5/1987 | Japan .................. 437/183 |
| 1-220460 | 9/1989 | Japan . |

OTHER PUBLICATIONS

English Translation of JP 61-59548 to Fukuchi et al (before called Matsushita).
Electronics and Communications in Japan, Part 2, vol. 17, No. 10, 1988, pp. 32-38; "Direct Formation of Solder Bump on Al Pad Using Ultrasonic Soldering", Inaba et al.

Primary Examiner—Brian E. Hearn
Assistant Examiner—Laura M. Holtzman
Attorney, Agent, or Firm—Finnegan, Henderson, Farabow, Garrett and Dunner

[57] ABSTRACT

A semiconductor element is formed in a semiconductor substrate. An electrode wiring pattern which is connected to the active region and contains aluminum as the main component is formed on the main surface of said semiconductor substrate. A metal bump is formed on the electrode wiring pattern. The metal bump contains zinc of 1 to 10% in mass percentage in addition to at least one element selected from a group consisting of tin, lead and aluminum a second metal bump is formed having a lower melting point than that of first bump. The second bump contains lead, tin and at least one of silver and copper.

9 Claims, 3 Drawing Sheets

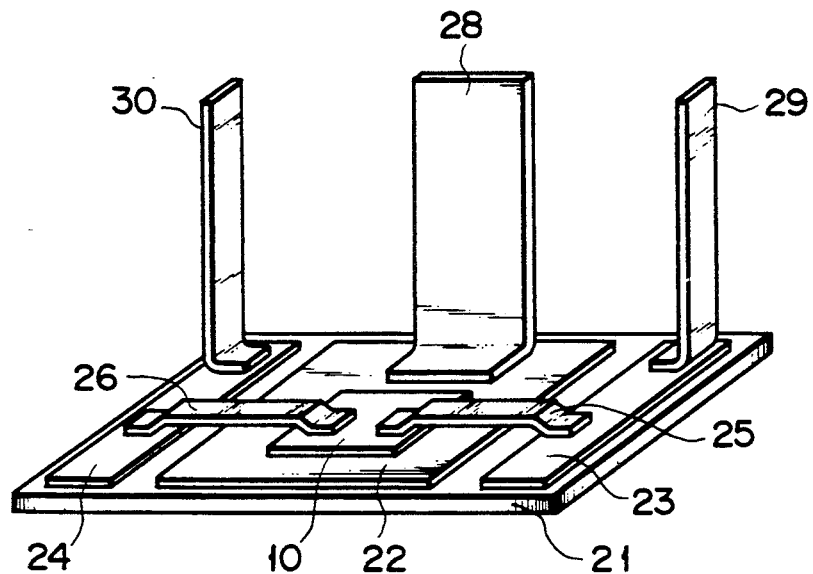
F I G. 4
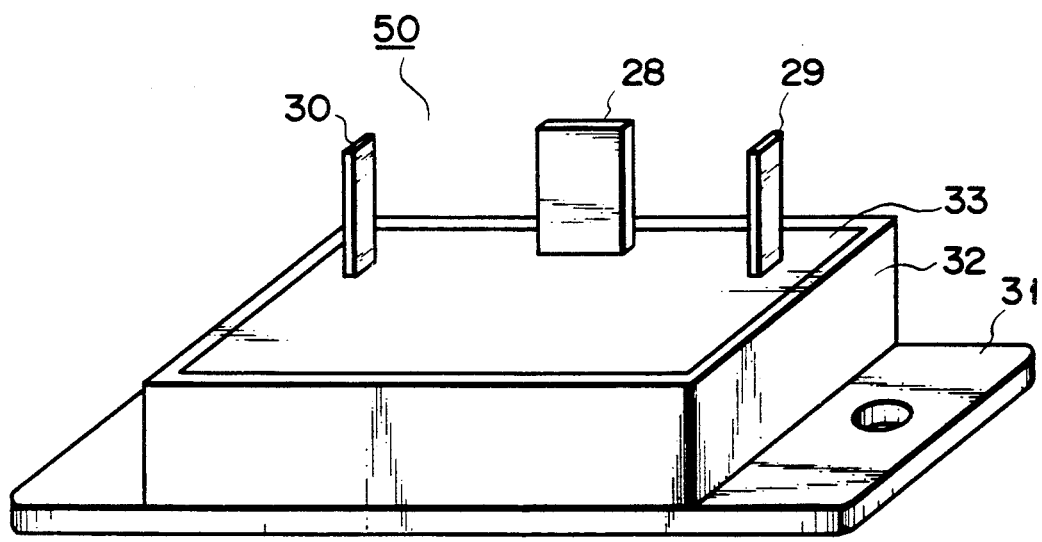
F I G. 5

METAL BUMP TYPE SEMICONDUCTOR DEVICE AND METHOD FOR MANUFACTURING THE SAME

This application is a continuation of application Ser. No. 07/399,234, filed Aug. 29, 1989, now abandoned.

BACKGROUND OF THE INVENTION

1. Field of the Invention

This invention relates to a semiconductor device having a metal bump formed therein and a method for manufacturing the same, and more particularly to a metal bump type semiconductor device having a metal bump formed directly on an electrode wiring pattern of Al or Al alloy without using a backing metal layer and a method for manufacturing the same.

2. Description of the Related Art

Various wireless bonding techniques for a semiconductor device such as a tape automated bonding (TAB) method, flip-chip method and controlled collapse bonding (CCB) method are known. With these methods, a metal bump formed of Au, solder or the like is generally formed on the electrode of the semiconductor chip and a metal connector or inner lead wire is connected to the metal bump to lead out the electrode of the semiconductor element formed on the chip to the exterior. Pb-Sn (solder) which is inexpensive is frequently used as material of the metal bump.

FIG. 1 shows portion of the prior art semiconductor device including a bump of Pb-Sn. That is, insulation film 2 of $SiO_2$, for example is formed on silicon substrate 1 and electrode wiring pattern 3 of Al or Al alloy (which is simply referred to as an Al electrode) is formed on insulation film 2. Passivation insulation film 4 formed of SiN film or the like is formed on insulation film 2 and Al electrode 3 to cover the same. Opening 4A is formed in that portion of passivation insulation film 4 which lies on Al electrode 3 so as to expose part of the surface of Al electrode 3. Backing metal layer 5 formed of Cr, Ni, Mo, Cu, Au, Ag or the like is formed on the exposed surface of Al electrode 3. Solder bump 6 is formed on backing metal layer 5 by plating or vapor deposition.

As described above, in the conventional semiconductor device having solder bump 6 formed on Al electrode 3 and a method for manufacturing the same, it is necessary to dispose backing metal layer 5 between Al electrode 3 and solder bump 6 in order to improve the bonding property between Al electrode 3 and solder bump 6. Further, it is necessary to form a mask so as not to plate or vapor deposit solder on any portion other than the electrode portion when solder bump 6 is formed. As a result, the manufacturing process becomes complicated.

In order to solve the above problem, a method of forming a solder bump directly on the Al electrode without using a backing metal plate has been proposed and disclosed in Japanese Patent Disclosure No. 62-104143 made by the same applicant as that of this application. The method disclosed in the above Japanese Patent Disclosure is to form a solder bump by applying ultrasonic waves to molten solder so as to break a natural oxide film formed on the surface of the electrode of Al or Al aloy, for example. This method has received much attention as a wireless bonding method for the semiconductor device.

The principle of the method disclosed in the above Patent Disclosure is as follows: That is, when ultrasonic waves are applied to the molten solder with the molten solder kept in contact with the electrode portion of Al, Al alloy or the like, vaporized metal bubbles occur in the molten solder in the rarefaction or suction phase of the ultrasonic waves and the bubbles will be crushed and disappear in the next compression phase. When the compressed bubbles are destroyed, a strong shock is given to the surface of the Al electrode so that the natural oxide film formed on the Al electrode can be broken and at the same time solder is bonded to the newly created and exposed surface of the Al electrode. In this way, a solder bump is formed directly on the Al electrode without using a backing metal layer.

As a specific method, a wafer is dipped into molten solder in a solder bath and an ultrasonic transducer is inserted into the molten solder to apply ultrasonic waves to the molten solder. Alternatively, ultrasonic waves can be applied to the molten solder by vibrating the solder bath in an ultrasonic mode. Further, ultrasonic waves can be applied to the molten solder while the molten solder is set in contact with the Al electrode by using a soldering iron which can be vibrated in an ultrasonic mode. All the above-described methods are hereinafter referred to as an ultrasonic soldering method. It is generally understood that a solder bump can be formed directly on Al or Al alloy by the ultrasonic soldering method by using solder containing Sn as solder composition.

The above method is simple, but has the following basic problem because Sn-series solder is used and is not yet generally used in the field of a semiconductor industry, for example. The first problem is related to formation of an Al-Sn alloy layer and the second problem is related to absorption phenomenon of the base metal of Al or Al alloy caused by the presence of molten solder. The problems are explained in detail.

First, the first problem is explained. For example, in a case where a Pb-Sn eutectic alloy is used as the Sn-series solder and a solder bump is formed directly on an Al electrode, an Al-Sn alloy layer is formed between the Al electrode and the solder bump. A potential difference occurs between the Al-Sn alloy layer and the Al electrode to form a parasitic battery cell (or eutectic battery cell), thereby corroding the Al electrode. The Al-Sn alloy layer further grows when held at high temperatures (higher than 100° C.), further corroding the Al electrode and significantly degrading the bonding property of the junction between the solder and Al. In particular, when the solder bump is melted so as to be connected to a metal connector or inner lead for electrode lead-out, for example, after the solder bump is formed, the above alloy layer grows larger irrespective of the Pb-Sn composition ratio of the solder, significantly degrading the bonding property of the junction between the solder and Al.

Next, the second problem is explained. When the molten solder is set in contact with Al, a so-called absorption phenomenon in which Al is melted or absorbed into the solder occurs and proceeds at a relatively high speed irrespective of the Pb-Sn composition ratio. Since the processing time for forming the solder bump by the ultrasonic soldering method can be made shorter than several seconds, influence by the absorption action of Al can be suppressed so as to be negligible. However, when the solder is meted again to connect the bump to an inner lead or the like in the later step and if it is held at high temperatures for more than several tens of seconds, the absorption action of Al may proceed significantly. As a result, a portion of Al except the electrode portion on which the bump is formed is eaten by or absorbed into the solder, making it extremely difficult to selectively and precisely form the bump. Further, a top passivation film formed of SiN, for example, for chip protection is generally formed on the top layer of the semiconductor chip. If the SiN film is formed on the Al electrode, the solder bump can be formed with the SiN film used as a block film. At this time, if the absorption action proceeds and the solder penetrates into portion of the Al electrode under the SiN film, the SiN film may crack and cannot have a protection function as a passivation film.

As described above, in the conventional technique in which the solder bump is formed on the electrode wiring pattern containing Al as a main part through the backing metal layer, the manufacturing process becomes complicated and the productivity is lowered. It is possible to form the solder bump directly on the Al electrode by use of the ultrasonic soldering method using Sn-series solder. However, in this case, an Al-Sn alloy layer is formed and the absorption phenomenon of Al will occur. In particular, if the structure is placed under a high temperature condition in the step of connecting a metal connector or inner lead after the bump is formed, the Al-Sn alloy layer further grows and the absorption action further proceeds. As a result, the reliability of the semiconductor device is degraded.

In order to solve the above problems, the inventors made various experiments by ultrasonic soldering methods using solder containing Ag in addition to Pb-Sn. The presence of Ag caused $Ag_3Al$ ($Ag_2Al$) to be formed and prevented formation of an Al-Sn alloy layer. However, it was confirmed that the Ag-Al alloy layer was weak, and like the Al-Sn alloy layer, the weak Ag-Sn alloy layer will grow when the solder bump is melted again, thus making it impossible to attain a sufficiently high bonding strength. That is, the above problems could not be solved.

SUMMARY OF THE INVENTION

Accordingly, a first object of this invention is to provide a metal bump type semiconductor device having a high reliability.

A second object of this invention is to provide a metal bump type semiconductor device which can be formed at high productivity.

The first object of this invention is attained by a metal bump type semiconductor device comprising a semiconductor substrate; at least one semiconductor element formed in the semiconductor substrate; an electrode wiring pattern containing aluminum as the main component and formed on the main surface of the semiconductor substrate so as to be connected to the semiconductor element; and a metal bump formed on the electrode wiring pattern and containing zinc of 1 to 10% in mass percentage in addition to at least one element selected from a group consisting of tin, lead and aluminum.

With the above construction, since zinc is contained in the composition of the metal bump, an Al-Zn alloy layer can be formed on the interface between the metal bump and the electrode wiring pattern containing aluminum as the main component, thus providing a sufficiently high bonding strength. Further, even if the bump is melted again or set in the high temperature condition after the bump is formed, formation of unwanted Al-Sn alloy layer can be suppressed, thereby reducing influence by the absorption phenomenon of Al. As a result, the bonding strength between the Al electrode and the metal bump will not be degraded and can be kept sufficiently high. In this way, a metal bump type semiconductor device having a high reliability can be attained.

The second object of this invention can be attained by a manufacturing method for metal bump type semiconductor devices comprising the steps of forming an active region for at least one semiconductor element in the main surface area of a semiconductor substrate; forming an electrode wiring pattern which is connected to the active region and contains aluminum as the main component on the semiconductor substrate; covering the electrode wiring pattern with an insulation film; selectively removing the insulation film to expose part of the electrode wiring pattern; and forming a metal bump on the exposed part of the electrode wiring pattern by dipping the semiconductor substrate into molten metal containing zinc of 1 to 10% in mass percentage in addition to at least one element selected from a group consisting of tin, lead and aluminum while ultrasonic waves are being applied to the molten metal.

According to the above manufacturing method, ultrasonic vibration is applied to the molten metal to destroy or strip off natural oxide films on the Al electrode which is set in contact with the molten metal, thus exposing a newly formed surface of Al. An Al-Zn layer is formed on the newly formed surface and the molten metal is adhered to the layer, thereby making it possible to form the metal bump directly on the Al electrode. Therefore, it is not necessary to form a backing metal layer and no mask is necessary because a plating or vapor deposition method is not used. As a result, a highly productive manufacturing method for metal bump type semiconductor devices can be provided.

BRIEF DESCRIPTION OF THE DRAWINGS

FIG. 4 is a perspective view showing the arrangement of the assembly of a semiconductor chip and metal connector shown in FIG. 2;

FIG. 5 is a perspective view of a semiconductor device obtained by sealing the assembly of FIG. 4 in a package.

DETAILED DESCRIPTION OF THE PREFERRED EMBODIMENTS

Figure 1:
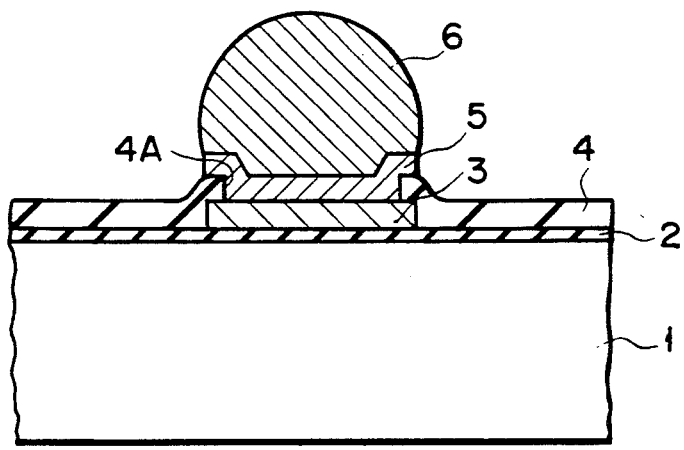
FIG. 1 is a cross sectional view of portion including a solder bump of the conventional semiconductor device.
Figure 2:
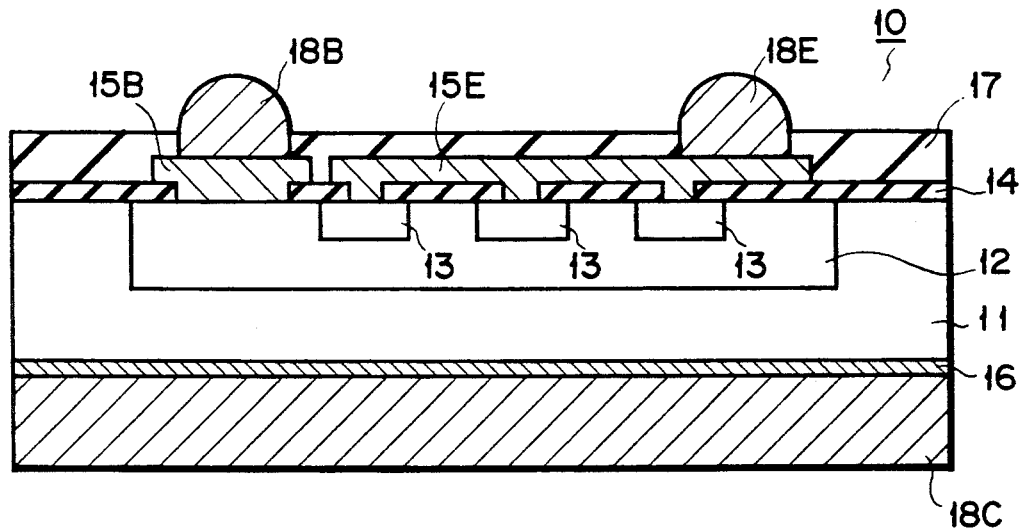
FIG. 2 is a cross sectional view of a chip of a metal bump type semiconductor device according to a first embodiment of this invention.

FIG. 2 is a cross sectional view of chip 10 of a solder bump type power bipolar transistor according to a first embodiment of this invention. First, base region 12 and emitter region 13 ar formed by a well known method in the main surface area of silicon substrate 11 to be used as a collector region. In this embodiment, a high power transistor whose chip size is as large as 10 mm × 10 mm is used as an example, and emitter region 13 is formed with a plurality of divided sections so as to make current flowing in the chip of large area constant. Thermal oxide film 14 is formed on the entire surface of substrate 11 and holes for electrode lead-out of base region 12 and emitter region 13 are formed in those portions of thermal oxide film 14 which lie on base region 12 and emitter region 13 by a photo-etching process. Next, a layer containing aluminum as the main component (which means an Al layer or Al alloy layer formed by adding Si or Cu of less than several % into Al, for example, and is hereinafter referred to as an Al layer) is formed on thermal oxide film 14 by vapor deposition and then the Al layer is patterned to form base electrode wiring pattern 15B and emitter electrode wiring pattern 15E. After this, insulation film (SiN film) 17 is formed on the entire surface of the resultant semiconductor structure and as a result Al electrode wiring patterns (referred to as Al electrodes) 15B and 15E and thermal oxide film 14 are covered with insulation film 17. Then, portion of insulation film 17 corresponding to Al electrode lead-out areas is selectively removed by photo-etching to expose parts of Al electrodes 15B and 15E. Further, Ni layer 16 used for the collector electrode lead-out is formed in ohmic contact with and on the other surface (rear surface in FIG. 2) of silicon substrate 11.

Figure 3:
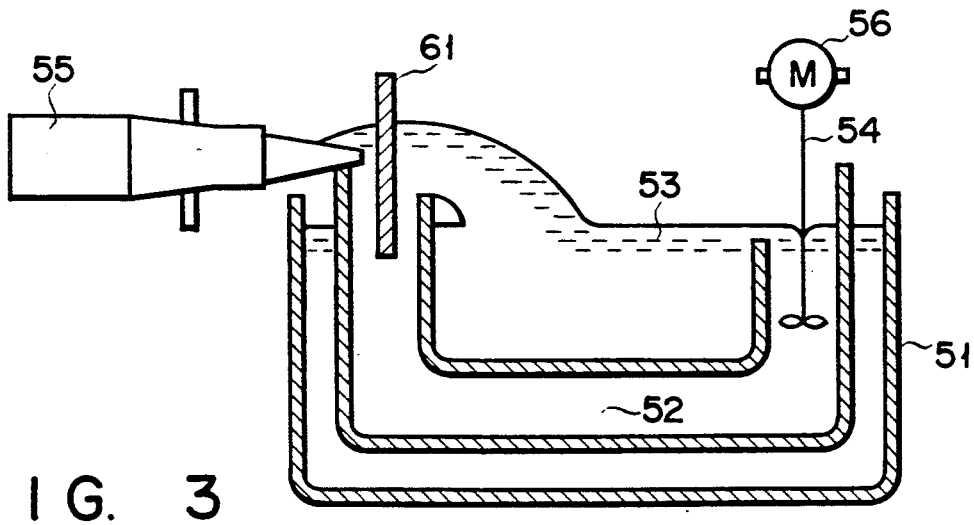
FIG. 3 is a view showing the construction of an ultrasonic solder bump forming device used in a manufacturing method for the metal bump type semiconductor device of this invention.

Solder bumps 18B and 18E are formed directly on the exposed portions of Al electrodes 15B and 15E of silicon wafer 61 formed by the above manufacturing method by using an ultrasonic solder bump forming device shown in FIG. 3. Molten solder 53 is received in solder bath 51 of the ultrasonic solder bump forming device. Solder bath 51 is provided with reflux path 52 and molten solder 53 is moved through reflux path 52 and raised higher than the liquid level by agitator 54 driven by motor 56 and is then returned to the main portion. Silicon wafer 61 is supported by a holding member (not shown) and dipped into the pushed-up portion of molten solder 53. Further, ultrasonic transducer 55 is inserted into the pushed-up portion of molten solder 53 near silicon wafer 61 to apply ultrasonic waves to molten solder 53.

In this embodiment, molten solder 53 containing Zn of 5%, Sn of 5% and Pb of 90% in mass percentage (hereinafter the composition percentage is simply expressed in % but it should be understood that it expresses the mass percentage) is used. When solder bumps 18B and 18E are formed, ultrasonic waves of a frequency of 20 KHz an output power of 80 W were applied by ultrasonic transducer 55 and silicon wafer 61 was kept dipped in molten solder 53 for 1 second. In the solder bump forming operation, nitrogen gas was supplied around the solder bump forming device at a flow rate of 10 liter/minute to prevent oxidation of Al which is the constituent element of Al electrodes 15B and 15E and Sn, Pb and Zn which are components of the solder. In particular, Zn is liable to be oxidized in the liquid surface portion of solder bath 51. If the oxide is attached to the surface of solder bumps 18B and 18E when silicon wafer 61 is pulled out of solder bath 51, the attached oxide may become an obstacle to the soldering process effected in the later stage.

After the ultrasonic soldering process is effected, solder bumps 18B and 18E of the height of approx. 80 μm are formed on Al electrodes 15B and 15E, respectively, and at the same time, solder layer 18C is formed on Ni layer 16 on the opposite side of substrate 11. In a case where it is preferable not to form solder layer 18C on Ni layer 16, a mask of polyimide or the like may be previously formed on Ni layer 16 before the silicon wafer is dipped into solder bath 51.

Semiconductor (solder bump type power bipolar transistor) chip as shown in FIG. 2 can be obtained by dicing silicon wafer 61 having solder bumps 18B and 18E formed thereon. An ordinary blade dicing method can be used for the dicing process. However, in a case where solder layer 18C is formed on Ni layer 16 on the opposite side of substrate 11, it is preferable to effect the blade dicing process after it is attached to an adhesive tape since the surface of solder layer 18C is rough.

Next, a process of assembling semiconductor chip 10 and an electrode lead-out metal member on ceramic substrate 21 is explained with reference to FIG. 4. As shown in FIG. 4, a unit having three metal (Cu) plates 22, 23 and 24 fixed on ceramic substrate 21 is prepared. Then, Ni layer 16 on the collector side of semiconductor chip 10 is soldered to metal plate 22 by use of solder layer 18C or additional solder. Next, solder bump 18E and solder bump on the emitter side and base side of semiconductor chip 10 are soldered to metal plates 23 and 24 by means of metal (Cu) connectors 25 and 26, respectively. Further, one end of each of outer lead metal plates 28, 29 and 30 is soldered to a corresponding one of metal plates 22, 23 and 24 and the underside surface of ceramic substrate 21 is soldered to heat radiation metal plate 31 (FIG. 5). A sequence of soldering operations described above may be simultaneously effected in a reflow furnace heat treatment furnace). After this, as shown in FIG. 5, resin casing 32 is mounted, resin 33 is filled in resin casing 32 with the other ends of outer lead metal plates 28, 29 and 30 extending outwardly and heated and cured for sealing. In this way, solder bump type semiconductor device 50 as shown in FIG. 5 can be obtained.

In semiconductor device 50 of this invention, ultrasonic waves are applied to the molten solder to form the solder bump directly on the Al electrode. The manufacturing process can be simplified in comparison with the conventional method wherein a solder bump is formed via a backing metal plate. Further, a problem of the conventional manufacturing method that an Al-Sn layer is formed and an eutectic battery is resultantly formed when forming a solder bump directly on the Al electrode by applying ultrasonic waves to Sn-series molten solder can be solved by adding Zn of 5% in mass percentage into the solder bump. Also, a problem that the Al-Sn alloy layer grows to degrade the bonding property and the absorption action of Al further proceeds because of the heat treatment effected for melting the solder bump for connection with a metal connector after the solder bump has been formed can be markedly suppressed by adding Zn into the solder bump. This may be because an Al-Zn alloy layer is formed on the interface between the Al electrode and the solder bump and functions to suppress the interaction between the Al electrode and the molten solder. Further, in this invention in which the Al-Zn alloy layer is formed, the junction area can be made sufficiently strong in comparison with the case wherein an Sn-series solder containing Ag is used in order to prevent formation of the Al-Sn alloy layer and in this case a weak Al-Ag alloy layer is formed on the interface. As a result, a semiconductor device with high reliability and high productivity can be obtained.

The semiconductor device of the above embodiment is a so-called high power transistor module which is generally used as a switching element for current of several tens of amperes. Conventionally, this type of high power transistor has a number of Al metal fine wires ($\leq 500$ μm) bonded between the emitter Al electrode and the electrode lead-out metal plate by the ultrasonic wire bonding method and has a current capacity of several tens of amperes. However, when an accident happens, a large current of several hundreds of amperes may flow, thereby destroying the ultrasonic bonding portion between the Al fine wires and the Al electrode of the semiconductor chip to separate them from each other. In general, the above transistor is used in a common-emitter connection with several hundreds of volts applied between the emitter and the collector. Therefore, if the Al fine wire of the emitter is peeled or separated from the bonding portion, an arc occurs therebetween to fuse the Al fine wire. Further, another arc may occur between the fused Al metal fine wire and the Al electrode of the chip to extremely raise the temperature in the casing, leading to an accident of blowing up the casing.

A problem of the high power transistor module manufactured by the conventional metal fine wire bonding method can be solved in the high power transistor module according to one embodiment of this invention. That is, the bonding portion between the metal connector and the Al electrode of the semiconductor chip can be mechanically strengthened by bonding the metal connector and the Al electrode of the semiconductor chip to each other by means of a solder bump (electrode-formation by solder). Therefore, a large current flowing in the above accident will not cause the metal connector to be separated from the bonding portion, preventing the occurrence of an arc. The Al electrode may generally provide a good ohmic contact property when connected with a silicon substrate and can be precisely etched so as to be easily formed in a fine electrode wiring pattern. In the semiconductor device of this invention, highly reliable electrode-formation by solder can be easily attained by forming the Al electrode having the above-described excellent properties by use of the conventional semiconductor chip manufacturing process as it is without effecting complicated succeeding steps of forming a backing metal layer by plating or vapor depositing and difficult selective etching.

Now, the composition of solder which is important in this invention is explained.

In the above embodiment, a solder of the composition containing Zn of 5%, Sn of 5% and Pb of 90% is used, but the composition is not limited to this. According to the experiments made by the inventors of this invention, it is confirmed that a solder bump can be formed on the Al electrode if the composition of the solder bump contains Sn of 5 to 95%, Zn of 1 to 10% and Pb (the entire remaining portion) and the bonding strength of the junction between the Al electrode and the solder bump can be kept sufficiently high even after the solder bump is melted again. The above confirmation was obtained by effecting a tension test in a direction perpendicular to the junction plane between the Al electrode and the solder bump after the solder bump was melted again and the metal connector was connected thereto. In this case, the "sufficiently high bonding strength" means that a shell crack has occurred in the substrate surface of the chip without causing the peeling in the interface of the alloy layers of the solder or the shear in the solder.

Further, according to the experiments made by the inventors of this invention, it is confirmed that the bonding strength of the junction between Al electrodes 15B, 15E and solder bumps 18B, 18E may become lower than a desired value when the content of Zn in solder bumps 18B and 18E is less than 1%. On the other hand, in a case where the content of Zn is more than 10%, the fluidity of the solder becomes low when the solder bump is melted again to connect the solder bump to a metal connector or inner lead. As a result, the wettability of the solder with the connector metal is reduced. Further, when the content of Sn is more than 5%, it is not necessary to add Pb into the solder bump in view of the bonding strength. However, when a Zn-Sn solder is used, the speed of the absorption action of Al into the molten solder becomes slightly higher, necessitating the severe control for the re-melting period of time and temperature. In a case where the composition of the solder bump contains Pb, Sn and Zn, the speed of the absorption of Al into the molten solder tends to be lowered as the composition ratio of Pb increases. The solder bump is melted again in the step of connecting the metal connector to the solder bump. It was confirmed by experiments that the re-melting time and temperature in the above step could be easily controlled if the composition ratio of Pb was set equal to or higher than 50%. As the result of this, it is preferable to set the composition of the solder bump so as to contain Zn of 1 to 10%, Sn of 5 to 45% and Pb of 50% or more than 50%.

Figure 6:
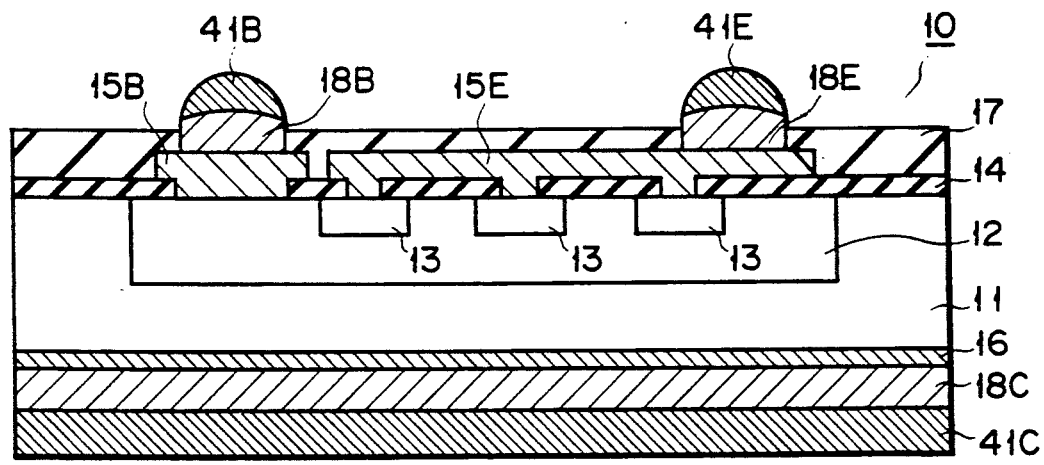
FIGS. 6 to 8 are cross sectional views of chips of metal bump type semiconductor devices according to second to fourth embodiments of this invention.
Figure 7:
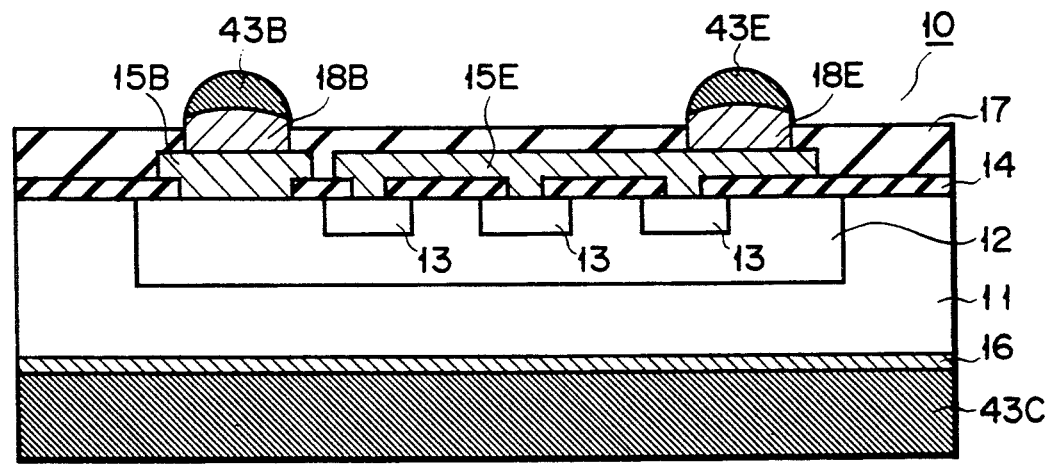

Next, the second embodiment of this invention is explained with reference to FIG. 6. Portions in FIG. 6 which correspond to those of FIG. 2 are denoted by the same reference numerals and the explanation therefor is omitted. As shown in FIG. 6, a solder bump is formed with a laminated structure of first and second solder bumps. In this embodiment, the same manufacturing process as in the first embodiment is effected until Al electrodes 15B and 15E are formed on a semiconductor wafer and first solder bumps 18B and 18E containing Pb of 90%, Sn of 5% and Zn of 5% as the composition thereof are formed on Al electrodes 15B and 15E. After first solder bumps 18B and 18E are formed, a Pb-Sn eutectic solder having a melting point lower than that of the first solder bump is formed on first solder bumps 18B and 18E to form second solder bumps 41B and 41E. At the same time as formation of second solder bumps 41B and 41E, solder layer 41C is formed on the rear surface of chip 10 on the collector electrode side. In this embodiment, first solder bumps 18B and 18E are formed to be 30 μm high on the exposed surfaces of Al electrodes 15B and 15E of 1.0 mm×2.5 mm and second solder bumps 41B and 41E are formed to be 150 μm high.

With this construction, since second solder bumps 41B and 41E can be formed at temperatures lower than the melting point of first solder bumps 18B and 18E, first solder bumps 18B and 18E can be kept in the solid phase during the formation of second solder bumps 41B and 41E and prevented from being melted again. Therefore, the absorption action of Al into first solder bumps 18B and 18E will not proceed. As a result, second solder bumps 41B and 41E can be formed to be as high (thick) as 150 μm, simplifying the step of mounting the metal connector.

The succeeding manufacturing steps are effected in the same manner as in the first embodiment. Also, the metal connector is connected to second solder bumps 41B and 41E at temperatures lower than the melting point of first solder bumps 18B and 18E. Therefore, in the step of mounting the metal connector, first solder bumps 18B and 18E ca be kept in the solid phase and prevented from being melted again. As a result, the absorption action of Al electrodes 15B and 15E into first solder bumps 18B and 18E will not further proceed. At this time, since second solder bumps 41B and 41E do not contain Zn as the composition, the fluidity of second solder bumps 41B and 41E can be kept sufficiently high. Further, since there is no possibility that oxide of Zn is formed on the surfaces of second solder bumps 41B and 41E, it is not necessary to pay much attention to the condition of atmosphere. In addition, the wettability of second solder bumps 41B and 41E with respect to the connector metal is extremely high. As a result, a good bonding by soldering can be easily attained without using flux o the like.

Next, the third embodiment of this invention is explained. In this embodiment, a Pb-Sn solder containing Ag (or Cu) is used to form second solder bumps 41B and 41E used in the second embodiment.

As described in the first embodiment, in a case where semiconductor chip 10 has an area as large as 10 mm × 10 mm, a stress caused by the difference in thermal expansion between collector Ni layer 16 on the rear surface of the chip and metal plate 22 (FIG. 4) for supporting the chip with the solder held therebetween is applied to the solder. The stress may be repeatedly applied to the solder to make it fragile. For this reason, when a chip with a large area is soldered on and supported by a metal plate, much care should be taken to the composition of the solder. In general, it is known in the art that the withstanding ability for the weakening of the solder can be enhanced by using a Pb-Sn solder containing Ag or Cu.

The third embodiment is made with care taken to the improvement of the withstanding ability. That is, in forming first solder bumps 18B and 18E in the second embodiment, Ni layer 16 to be used as a collector electrode is coated with resin such as polyimide to prevent solder from being attached to first solder bumps 18B and 18E in the step of forming first solder bumps 18B and 18E. Then, after the mask resin is removed, second solder bumps 41B and 41E are formed and at the same time solder layer 43C having the same solder composition as that of second solder bumps 41B and 41E and containing Ag of 1.5%, Sn of 5% and Pb of 93.5% is formed on Ni layer 16 on the collector electrode side.

Figure 8:
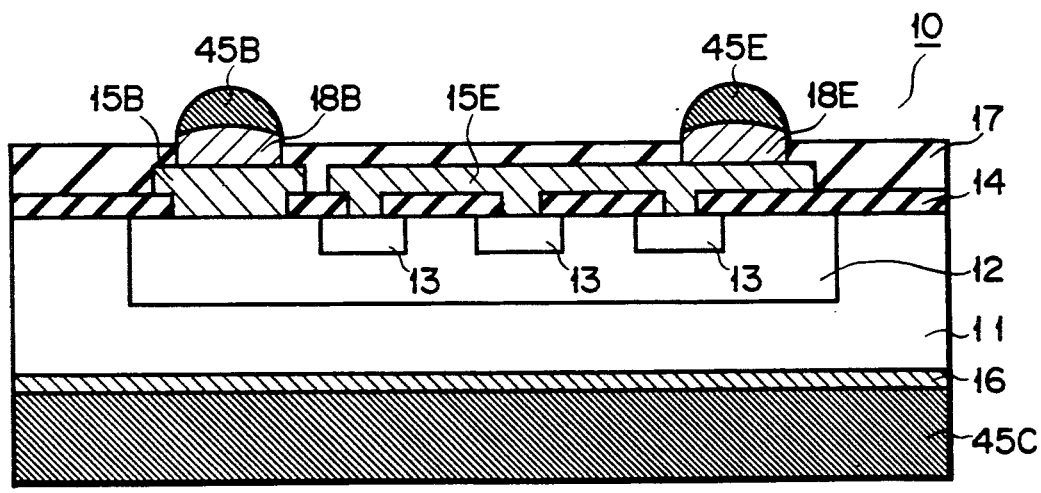

Next, the fourth embodiment in which the solder composition of first solder bumps 18B and 18E is Al-Zn is explained with reference to FIG. 8.

In the fourth embodiment, a solder containing Zn of 1 to 10% and Al as the entire remaining portion (99 to 90%) is used to form first solder bumps 18B and 18E. Since the melting point of the solder is 380° C. which is slightly higher than others, first solder bumps 18B and 18E can be formed directly on Al electrodes 15B and 15E by the ultrasonic soldering method under a condition that the temperature of solder bath 51 is set at 400° C. According to the experiments, it was found that the height of the solder bump which could be uniformly controlled was approx. 10 μm. In this case, in order to prevent an Al-Zn solder from being attached to the collector electrode, first solder bumps 18B and 18E were formed before Ni layer 16 was formed, that is, when the silicon surface was still exposed. After this, Ni layer 16 is formed on the rear surface of the chip on the collector electrode side by sputtering and then second solder bumps 45B and 45E are formed. In this case, a solder of the composition containing Ag of 1.5%, Sn of 5% and Pb as the entire remaining portion is used to form second solder bumps 45B and 45E. As a result, solder bumps of laminated solder layers of the respective solder composition containing Al-Zn and Pb-Sn-Ag are formed on base and emitter Al electrodes 15B and 15E and Pb-Sn-Ag solder layer 45C is formed on collector Ni layer 16. The succeeding steps are effected in the same manner as in the first embodiment to form the semiconductor device.

In the solder bump type semiconductor device according to the above embodiments of this invention, the composition of the first solder bump contains Zn so that the bonding portion between the Al electrode and the first solder bump can be formed with high reliability. It was confirmed by the experiments made by the inventors of this invention that the bonding strength of the junction between the Al electrode and the bump could be sufficiently high even after it was left for 1000 hours at a temperature of 125° C.

In the first to fourth embodiments, the semiconductor device is formed as a power bipolar transistor, but is not limited to it. That is, the Al electrode on the main surface of the semiconductor substrate is formed by a well known method, and the semiconductor device can be a diode, thyristor, GTO, IC or the like if it has the Al electrode thus formed. Further, it is also possible to form a Ti film under the Al electrode, or add Si or Cu into the Al electrode.

In the above embodiments, the solder composition of the first solder bump contains Zn-Sn-Pb and Zn-Al. However, this invention can be applied to a case wherein the solder composition of the first solder bump contains Zn and an element selected from a group consisting of Sn, Pb and Al, for example, Zn-Sn.

What is claimed is:

1. A method for manufacturing semiconductor devices comprising the steps of:

forming an active region for at least one semiconductor element in a main surface area of a semiconductor substrate;

forming an electrode layer, which contains aluminum as the main component, on the semiconductor substrate by deposition, and then patterning the electrode layer to thereby form an electrode wiring pattern connected to the active region;

covering said electrode wiring pattern with an insulation film;

selectively removing said insulation film to expose part of said electrode wiring pattern;

forming a nickel layer on a back surface of said semiconductor substrate and in ohmic contact therewith;

covering said nickel layer with a protective coating;

forming a first bump on the exposed part of said electrode wiring pattern by dipping said semiconductor substrate into molten metal while simultaneously applying ultrasonic waves to the molten metal, said molten metal containing zinc of 1 to 10% in mass percentage and at least one element selected from a group consisting of tin, lead and aluminum with said at least one element being present in an amount not less than 50% in mass percentage;

eliminating said protective coat; and forming a second bump having a composition including lead, tin, and at least one of silver and copper, and a melting point lower than that of said first bump, and an electrode on said nickel layer, which second bump forming step is performed without actually remelting said first bump at a temperature lower than the melting point of said first bump.

2. A method for manufacturing semiconductor devices according to claim 1, wherein said molten metal for forming said first bump consists essentially of lead, tin and zinc, with lead being not less than 50% in mass percentage.

3. A method for manufacturing semiconductor devices according to claim 1, wherein said molten metal for forming said first bump consists essentially of lead, tin and zinc, with tin being 5 to 95% in mass percentage, zinc being 1 to 10% in mass percentage and the balance being lead.

4. A method for manufacturing semiconductor devices according to claim 1, wherein said molten metal for forming said first bump consists essentially of lead, tin and zinc and with tin being 5 to 45% in mass percentage, zinc being 1 to 10% in mass percentage, and the balance being lead in an amount not less than 50% in mass percentage.

5. A method for manufacturing semiconductor devices according to claim 1, wherein said protective coating contains polyimide.

6. A method of manufacturing semiconductor devices according to claim 1, wherein said second bump consists essentially of lead, tin and silver, with silver being 1.5% in mass percentage, tin being 5% in mass percentage, and the balance being lead.

7. A method for manufacturing semiconductor devices comprising the steps of:
   forming an active region for at least one semiconductor element in a main surface area of a semiconductor substrate;
   forming an electrode layer, which contains aluminum as the main component, on the semiconductor substrate by deposition, and then patterning the electrode layer to thereby form an electrode wiring pattern connected to the active region;
   covering said electrode wiring pattern with an insulation film;
   selectively removing said insulation film to expose part of said electrode wiring pattern;
   forming a nickel layer on a back surface of said semiconductor substrate and in ohmic contact therewith;
   covering said nickel layer with a protective coating;
   forming a first bump on the exposed part of said electrode wiring pattern by dipping said semiconductor substrate into molten metal while simultaneously applying ultrasonic waves to the molten metal, said molten metal consisting essentially of lead, tin and zinc, with tin being 5 to 95% in mass percentage, zinc being 1 to 10% in mass percentage and the balance being lead;
   eliminating said protective coating; and
   forming a second bump having a composition consisting essentially of lead, tin and silver, with silver being 1.5% in mass percentage, tin being 5% in mass percentage and the balance being lead, and having a melting point lower than that of said first bump, and an electrode on said nickel layer, which second bump forming step is performed without actually remelting said first bump at a temperature lower than the melting point of said first bump.

8. A method for manufacturing semiconductor devices comprising the steps of:
   forming an active region for at least one semiconductor element in a main surface area of a semiconductor substrate;
   forming an electrode layer, which contains aluminum as the main component, on the semiconductor substrate by deposition, and then patterning the electrode layer to thereby form an electrode wiring pattern connected to the active region;
   covering said electrode wiring pattern with an insulation film;
   selectively removing said insulation film to expose part of said electrode wiring pattern;
   forming a nickel layer on a back surface of said semiconductor substrate and in ohmic contact therewith;
   covering said nickel layer with a protective coating;
   forming a first bump on the exposed part of said electrode wiring pattern by dipping said semiconductor substrate into molten metal while simultaneously applying ultrasonic waves to the molten metal, said molten metal consisting essentially of lead, tin and zinc, with tin being 5 to 45% in mass percentage, zinc being 1 to 10% in mass percentage and the balance being lead in an amount not less than 50% in mass percentage.
   eliminating said protective coating; and
   forming a second bump having a composition consisting essentially of lead, tin and silver, with silver being 1.5% in mass percentage, tin being 5% in mass percentage and the balance being lead, and having a melting point lower than that of said first bump, and an electrode on said nickel layer, which second bump forming step is performed without actually remelting said first bump at a temperature lower than the melting point of said first bump.

9. A method for manufacturing a semiconductor devices comprising the steps of:
   forming an active region for at least one semiconductor element in a main surface area of a semiconductor substrate;
   forming an electrode layer, which contains aluminum as the main component, on the semiconductor substrate by deposition, and then patterning the electrode layer to thereby form an electrode wiring pattern connected to the active region;
   covering said electrode wiring pattern with an insulation film;
   selectively removing said insulation film to expose part of said electrode wiring pattern;
   forming a nickel layer on a back surface of said semiconductor substrate and in ohmic contact therewith;
   covering said nickel layer with a protective coating;
   forming a first bump on the exposed part of said electrode wiring pattern by dipping said semiconductor substrate into molten metal while simultaneously applying ultrasonic waves to the molten metal, said molten metal consisting essentially of lead, tin and zinc, with lead being not less than 50% in mass percentage;
   eliminating said protective coating; and
   forming a second bump having a composition consisting essentially of lead, tin and silver, with silver being 1.5% in mass percentage, tin being 5% in mass percentage and balance being lead, and having a melting point lower than that of said first bump, and an electrode on said nickel layer, which second bump forming step is performed without actually remelting said first bump at a temperature lower than the melting point of said first bump.

* * * * *